US012765286B2

(12) United States Patent
Tanoue et al.

(10) Patent No.: US 12,765,286 B2
(45) Date of Patent: Oct. 13, 2026

(54) SUBSTRATE PROCESSING APPARATUS AND SUBSTRATE PROCESSING METHOD

(71) Applicant: Tokyo Electron Limited, Tokyo (JP)

(72) Inventors: Hayato Tanoue, Kikuchi-gun (JP); Kento Araki, Kikuchi-gun (JP); Yohei Yamashita, Kikuchi-gun (JP); Gousuke Shiraishi, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 519 days.

(21) Appl. No.: 18/261,518

(22) PCT Filed: Jan. 5, 2022

(86) PCT No.: PCT/JP2022/000100
§ 371 (c)(1),
(2) Date: Jul. 14, 2023

(87) PCT Pub. No.: WO2022/153895
PCT Pub. Date: Jul. 21, 2022

(65) Prior Publication Data

US 2024/0071765 A1 Feb. 29, 2024

(30) Foreign Application Priority Data

Jan. 15, 2021 (JP) ................................ 2021-005323

(51) Int. Cl.
*H01L 21/68* (2006.01)
*H10P 34/42* (2026.01)

(52) U.S. Cl.
CPC .................................. *H10P 34/42* (2026.01)

(58) Field of Classification Search
CPC ..... H01L 21/268; H01L 21/02; H01L 21/304; H01L 21/67092; H01L 21/185; B23K 26/53; B23K 26/0622

(Continued)

(56) References Cited

U.S. PATENT DOCUMENTS 7,696,065 B2 * 4/2010 Sato .................. H01L 21/02307 257/E21.57
8,486,806 B2 * 7/2013 Hirosawa .......... H01L 21/67132 438/464

(Continued)

FOREIGN PATENT DOCUMENTS

JP 2000-133809 A 5/2000
JP 2019-126844 A 8/2019
WO 2019176589 A1 9/2019

OTHER PUBLICATIONS

International Search Report of PCT/JP2022/000100 dated Mar. 15, 2022.

*Primary Examiner* — Vu A Vu
(74) *Attorney, Agent, or Firm* — Shih IP Law Group, PLLC.

(57) ABSTRACT

A substrate processing apparatus configured to process a combined substrate in which a first substrate, an interface layer including at least a laser absorbing film, and a second substrate are stacked on top of each other includes a substrate holder configured to hold the combined substrate; an interface laser radiating unit configured to radiate laser light to the laser absorbing film in a pulse shape; a moving mechanism configured to move the substrate holder and the interface laser radiating unit relative to each other; and a controller. The controller performs a control of acquiring information of the interface layer formed in the combined substrate, and a control of setting, based on the acquired information of the interface layer, a bonding interface having a weakest adhesive strength among bonding interfaces in the interface layer as a separation interface between the first substrate and the second substrate.

13 Claims, 9 Drawing Sheets

(58) Field of Classification Search
USPC .......................................................... 438/795
See application file for complete search history.

(56) References Cited

U.S. PATENT DOCUMENTS

| | | | | |
|---|---|---|---|---|
| 8,492,676 | B2 * | 7/2013 | Azuma | H01L 21/67092 219/121.72 |
| 8,669,166 | B1 * | 3/2014 | Agarwal | H01L 21/6836 438/459 |
| 9,111,983 | B1 * | 8/2015 | Ginter | H01L 21/768 |
| 9,214,353 | B2 * | 12/2015 | Yonehara | B23K 26/50 |
| 9,269,561 | B2 * | 2/2016 | Dang | H01L 21/02002 |
| 10,118,250 | B1 * | 11/2018 | Budd | G01B 11/26 |
| 10,189,048 | B2 * | 1/2019 | Yamazaki | B05B 13/0221 |
| 10,224,229 | B2 * | 3/2019 | Andry | H01L 21/6835 |
| 10,403,505 | B2 * | 9/2019 | Ito | H01L 21/304 |
| 10,586,726 | B2 * | 3/2020 | Andry | H01L 21/78 |
| 2014/0038392 | A1 | 2/2014 | Yonehara | |
| 2018/0076043 | A1 | 3/2018 | Ito | |
| 2021/0039203 | A1 | 2/2021 | Tanoue | |

* cited by examiner

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2022/000100 filed on Jan. 5, 2022, which claims the benefit of Japanese Patent Application No. 2021-005323 filed on Jan. 15, 2021 the entire disclosures of which are incorporated herein by reference.

TECHNICAL FIELD

The various aspects and embodiments described herein pertain generally to a substrate processing apparatus and a substrate processing method.

BACKGROUND

Patent Document 1 describes a substrate processing system having a modification layer forming apparatus configured to form, in a combined substrate in which a first substrate and a second substrate are bonded, a modification layer inside the first substrate along a boundary between a central portion of the first substrate and a peripheral portion thereof as a target of removing; and a periphery removing apparatus configured to remove the peripheral portion of the first substrate starting from the modification layer. Further, in Patent Document 1, it is also described that a modification surface is formed inside a device layer formed on a non-processing surface of the first substrate to reduce bonding strength between the first substrate and the second substrate at the peripheral portion of the first substrate.

PRIOR ART DOCUMENT

Patent Document 1: International Publication No. 2019/176589

DISCLOSURE OF THE INVENTION

Means for Solving the Problems

In an exemplary embodiment, a substrate processing apparatus configured to process a combined substrate in which a first substrate, an interface layer including at least a laser absorbing film, and a second substrate are stacked on top of each other includes a substrate holder configured to hold the combined substrate; an interface laser radiating unit configured to radiate laser light to the laser absorbing film in a pulse shape; a moving mechanism configured to move the substrate holder and the interface laser radiating unit relative to each other; and a controller configured to control the interface laser radiating unit and the moving mechanism. The controller performs a control of acquiring information of the interface layer formed in the combined substrate, and a control of setting, based on the acquired information of the interface layer, a bonding interface having a weakest adhesive strength among bonding interfaces in the interface layer as a separation interface between the first substrate and the second substrate.

BRIEF DESCRIPTION OF THE DRAWINGS

FIG. 113 is a side view illustrating another example structure of the combined wafer according to the exemplary embodiment.

DETAILED DESCRIPTION

Figure 1A:
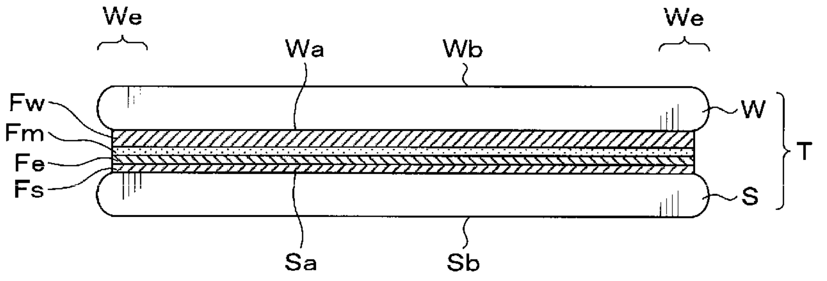
FIG. 1A is a side view illustrating an example structure of a combined wafer according to an exemplary embodiment.

In a manufacturing process for a semiconductor device, in a combined substrate in which a first substrate (a silicon substrate such as semiconductor substrate) having devices such as a plurality of electronic circuits formed on a front surface thereof and a second substrate are bonded to each other, removal of a peripheral portion of the first wafer, so-called edge trimming, may be performed.

The edge trimming of the first substrate is performed by using a substrate processing system described in Patent Document 1, for example. That is, a modification layer is formed by radiating laser light to an inside of the first substrate, and the peripheral portion is removed from the first substrate by using the modification layer as a starting point. Further, according to the substrate processing system described in Patent Document 1, a modification surface is formed by radiating laser light to an interface at which the first substrate and the second substrate are bonded, so that bonding strength between the first substrate and the second substrate at the peripheral portion is reduced.

In this edge trimming, laser light may be radiated to a laser absorbing layer (for example, an oxide film) formed between the first substrate and the second substrate to cause separation at the interface between the first substrate and the second substrate. However, when performing the edge trimming of the first substrate by radiating the laser light to the laser absorbing layer in this way, if the thickness of the laser absorbing layer is small, the amount of energy absorbed and accumulated in the laser absorbing layer by the radiation of the laser light is reduced, raising a risk that the edge trimming of the first substrate may not be performed properly.

In view of the foregoing, the present disclosure provides a technique capable of separating the first substrate from the second substrate appropriately in the combined substrate in which the first substrate and the second substrate are bonded to each other. Hereinafter, a substrate processing system as a substrate processing apparatus and a substrate processing method according to an exemplary embodiment will be described with reference to the accompanying drawings. In the present specification and the drawings, parts having substantially the same functions and configurations will be assigned same reference numerals, and redundant description thereof will be omitted.

In a wafer processing system 1 to be described later according to the present exemplary embodiment, a processing is performed on a combined wafer T as a combined substrate in which a first wafer W as a first substrate and a second wafer S as a second substrate are bonded to each other, as shown in FIG. 1A. Hereinafter, in the first wafer W, a surface to be bonded to the second wafer S is referred to as front surface Wa, and a surface opposite to the front surface Wa is referred to as rear surface Wb. Likewise, in the second wafer S, a surface to be bonded to the first wafer W is referred to as front surface Sa, and a surface opposite to the front surface Sa is referred to as rear surface Sb.

The first wafer W is, for example, a semiconductor wafer such as a silicon substrate, and has a device layer (not shown) including a plurality of devices formed on the front surface Wa thereof. A laser absorbing film Fw as a laser absorbing layer, a metal film Fm as a separation facilitating film, and a surface film Fe are stacked on the front surface Wa of the first wafer W, and the surface film Fe is bonded to a surface film Fs of the second wafer S. A film such as, but not limited to, an oxide film ($SiO_2$ film or TEOS film) capable of absorbing laser light from a laser radiation system 110 to described later may be used as the laser absorbing film Fw. A film such as, but not limited to, a tungsten film whose adhesion to the surface film Fe is weaker than at least adhesion between the first wafer W and the laser absorbing film Fw may be used as the metal film Fm. Further, a peripheral portion We of the first wafer W is a portion to be removed in edge trimming to be described later, and is in the range of 0.5 mm to 3 mm from an outer end of the first wafer W in a radial direction. The surface film Fe may be, by way of non-limiting example, an oxide film (THOX film, $SiO_2$ film, or TEOS film), a SiC film, a SiCN film, an adhesive, or the like.

The second wafer S is a wafer configured to support the first wafer W, for example. The surface film Fs is formed on the front surface Sa of the second wafer S. As an example, the surface film Fs may be an oxide film (THOX film, $SiO_2$ film, or TEOS film), a SiC film, a SiCN film, or an adhesive. In addition, the second wafer S functions as a protective material (support wafer) configured to protect a device layer D of the first wafer W. Furthermore, the second wafer S does not have to be a support wafer, and may be a device wafer having a non-illustrated device layer formed thereon, the same as the first wafer W.

In addition, in the combined wafer T according to the present exemplary embodiment, the above-described laser absorbing film Fw, metal film Fm, surface film Fe, and surface film Fs correspond to "interface layer" according to the present disclosure.

The following description will be provided for an example in which the combined wafer T having the laser absorbing film Fw, the metal film Fm, the surface film Fe, and the surface film Fs formed at the interface between the first wafer W and the second wafer S as shown in FIG. 1A is processed in the wafer processing system 1. However, the structure of the combined wafer T processed in the wafer processing system 1 is not limited thereto.

Figure 1B:
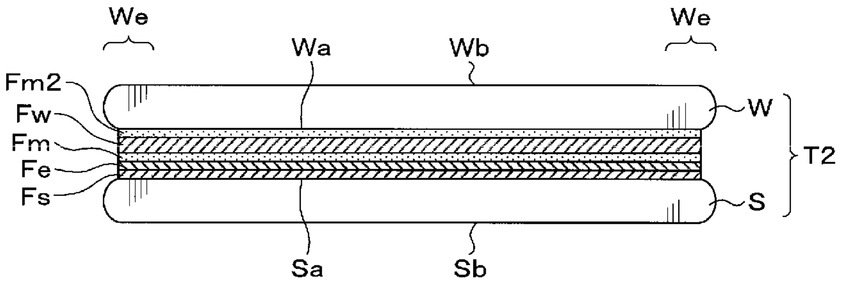

For example, in the wafer processing system 1, a combined wafer T2 further including, as shown in FIG. 1B, a surface film Fm2 serving as a second separation facilitating film formed at an interface between the front surface Wa of the first wafer W and the laser absorbing film Fw may be processed. As the surface film Fm2, a film (for example, Si N film) whose adhesion to the front surface Wa of the first wafer W is smaller than at least adhesion of the laser absorbing film Fw and which is capable of transmitting the laser light from the laser radiation system 110 to be described later may be used. At this time, adhesion between the metal film Fm and the surface film Fe is smaller than the adhesion between the front surface Wa of the first wafer W and the surface film Fm2.

Figure 2:
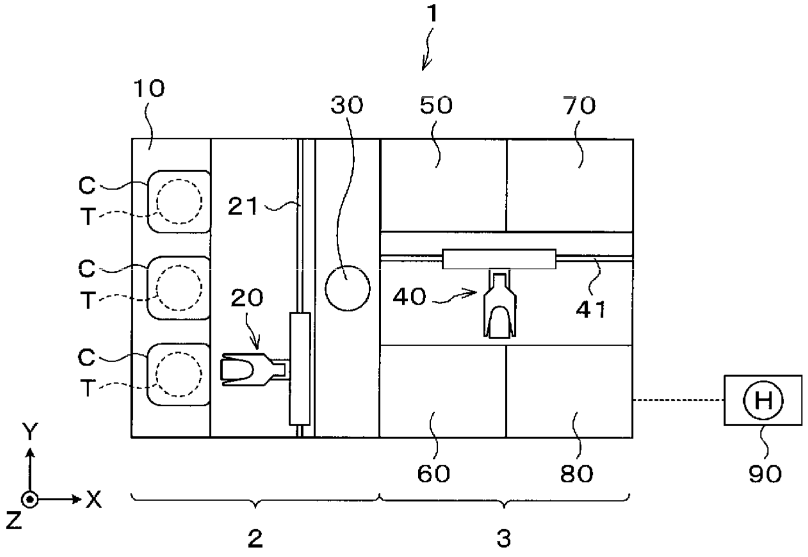
FIG. 2 is a plan view illustrating a schematic configuration of a wafer processing system according to the exemplary embodiment.

As illustrated in FIG. 2, the wafer processing system 1 has a configuration in which a carry-in/out station 2 and a processing station 3 are connected as one body. In the carry-in/out station 2, a cassette C capable of accommodating therein a plurality of combined wafers T is carried to/from the outside, for example. The processing station 3 is equipped with various types of processing apparatuses configured to perform required processings on the combined wafer T.

The carry-in/out station 2 is equipped with a cassette placing table 10 configured to place thereon the cassette C capable of accommodating therein the plurality of combined wafers T. Further, a wafer transfer device 20 is provided adjacent to the cassette placing table 10 on the positive X-axis side of the cassette placing table 10. The wafer transfer device 20 is configured to be moved on a transfer path 21 extending in the Y-axis direction to transfer the combined wafer T between the cassette C of the cassette placing table 10 and a transition apparatus 30 to be described later.

In the carry-in/out station 2, the transition apparatus 30 configured to deliver the combined wafer T to/from the processing station 3 is provided adjacent to the wafer transfer device 20 on the positive X-axis side of the wafer transfer device 20.

The processing station 3 is equipped with a wafer transfer device 40, a periphery removing apparatus 50 as a periphery removing unit, a cleaning apparatus 60, an interface modifying apparatus 70 as an interface laser radiating unit, and an internal modifying apparatus 80 as an internal laser radiating unit.

The wafer transfer device 40 is provided on the positive X-axis side of the transition apparatus 30. The wafer transfer device 40 is configured to be movable on a transfer path 41 extending in the X-axis direction, and is configured to transfer the combined wafer T to/from the transition apparatus 30 of the carry-in/out station 2, the periphery removing apparatus 50, the cleaning apparatus 60, the interface modifying apparatus 70, and the internal modifying apparatus 80.

The periphery removing apparatus 50 is configured to perform removal of the peripheral portion We of the first wafer W, that is, edge trimming. The cleaning apparatus 60 is configured to perform a cleaning processing on an exposed surface of the second wafer S after the edge trimming to remove particles on the exposed surface. The interface modifying apparatus 70 is configured to radiate laser light (laser light for interface, such as $CO_2$ laser) to the interface between the first wafer W and the second wafer S to form a non-bonding region Ae to be described later. A detailed configuration of the interface modifying apparatus 70 will be described later. The internal modifying apparatus 80 is configured to radiate laser light (laser light for inside, such as YAG laser) to the inside of the first wafer W to form a peripheral modification layer M1 serving as a starting point for separation of the peripheral portion We and a split modification layer M2 serving as a starting point for division of the peripheral portion We into smaller pieces.

The above-described wafer processing system 1 is equipped with a control device 90 as a controller. The control device 90 is, for example, a computer, and has a program storage (not shown). The program storage stores therein a program for controlling the processing of the combined wafer T in the wafer processing system 1. The program storage also stores therein a program for implementing a wafer processing to be described later in the wafer processing system 1 by controlling operations of a driving system such as the transfer devices and the various types of processing apparatuses described above. In addition, the programs may have been recorded in a computer-readable recording medium H, and may be installed from the recording medium H to the control device 90.

Now, the detailed configuration of the interface modifying apparatus 70 will be discussed.

Figure 3:
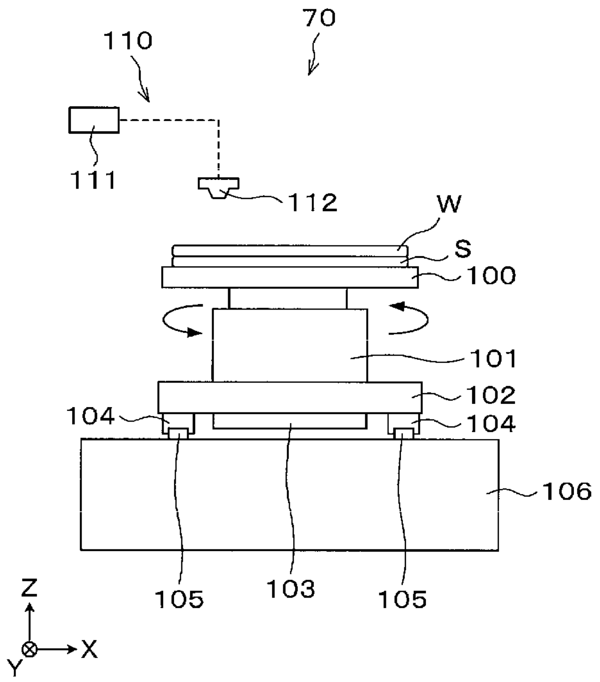
FIG. 3 is a side view illustrating a schematic configuration of an interface modifying apparatus according to the exemplary embodiment.

As depicted in FIG. 3, the interface modifying apparatus 70 has a chuck 100 as a substrate holder configured to hold the combined wafer T on a top surface thereof. The chuck 100 attracts and holds the rear surface Sb of the second wafer S.

The chuck 100 is supported by a slider table 102 with an air bearing 101 therebetween. A rotating mechanism 103 is provided on a bottom surface of the slider table 102. The rotating mechanism 103 incorporates therein, for example, a motor as a driving source. The chuck 100 is configured to be rotatable around a θ-axis (vertical axis) via the air bearing 101 by the rotating mechanism 103. The slider table 102 is configured to be movable along a rail 105 extending in the Y-axis direction by a horizontally moving mechanism 104 provided on a bottom surface thereof. The rail 105 is provided on a base 106. In addition, although a driving source of the horizontally moving mechanism 104 is not specifically limited, a linear motor is used, for example. In the present exemplary embodiment, the rotating mechanism 103 and the horizontally moving mechanism 104 mentioned above correspond to "moving mechanism" according to the present disclosure.

Above the chuck 100, there is provided the laser radiation system 110. The laser radiation system 110 has a laser head 111 and a lens 112. The lens 112 may be configured to be movable up and down by an elevating mechanism (not shown).

The laser head 111 has a non-illustrated laser oscillator configured to oscillate laser light in a pulse shape. That is, the laser light radiated from the laser radiation system 110 to the combined wafer T held by the chuck 100 is a so-called pulse laser, and its power repeats 0 (zero) and a maximum value. Further, in the present exemplary embodiment, the laser light is $CO_2$ laser light, and the wavelength of this $CO_2$ laser light is in the range of, e.g., 8.9 μm to 11 μm. In addition, the laser head 111 may have other devices of the laser oscillator, such as an amplifier.

The lens 112 is a cylindrical member, and radiates the laser light to the combined wafer T held by the chuck 100. The laser light emitted from the laser radiation system 110 is radiated to and absorbed by the laser absorbing film Fw after penetrating the first wafer W.

Now, a wafer processing performed by using the wafer processing system 1 configured as described above will be explained. As an example, the present exemplary embodiment will be described for the case where the peripheral portion We of the first wafer W is separated from the second wafer S in the wafer processing system 1 (that is, so-called edge-trimming is performed), as stated above. Further, in the present exemplary embodiment, the combined wafer T is formed in advance by bonding the first wafer W and the second wafer S in a bonding apparatus (not shown) outside the wafer processing system 1.

First, the cassette C accommodating the plurality of combined wafers T is placed on the cassette placing table 11 of the carry-in/out station 2.

Figure 4A:
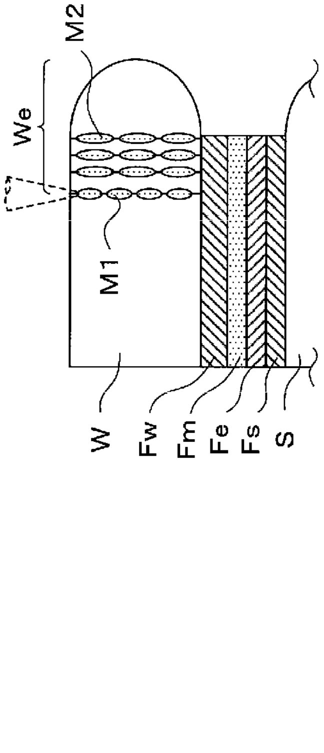
FIG. 4A to FIG. 4D are explanatory diagrams illustrating main processes of a wafer processing in the wafer processing system.

Then, the combined wafer T in the cassette C is taken out by the wafer transfer device 20, and transferred to the internal modifying apparatus 80 via the transition apparatus 30. In the internal modifying apparatus 80, by radiating the laser light to the inside of the first wafer W, the peripheral modification layer M1 and the split modification layer M2 are formed, as shown in FIG. 4A. The peripheral modification layer M1 serves as a starting point when removing the peripheral portion We in the edge trimming to be described later. The split modification layer M2 serves as a starting point when dividing the peripheral portion We being removed into smaller pieces. In the drawings to be referred to in the following description, illustration of the split modification layer M2 may be omitted in order to avoid complication of the illustration.

Figure 4B:
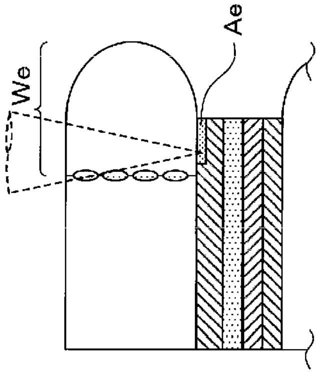

The combined wafer T in which the peripheral modification layer M1 and the split modification layer M2 are formed within the first wafer W is then transferred to the interface modifying apparatus 70 by the wafer transfer device 40. In the interface modifying apparatus 70, the laser light is radiated in the pulse shape to the interface (more specifically, the above-described laser absorbing film Fw formed at the interface) between the first wafer W and the second wafer Sat the peripheral portion We, while rotating the combined wafer T (the first wafer W) and moving it in the Y-axis direction. As a result, as depicted in FIG. 4B, separation occurs at the interface between the first wafer W and the second wafer S.

Figure 5:
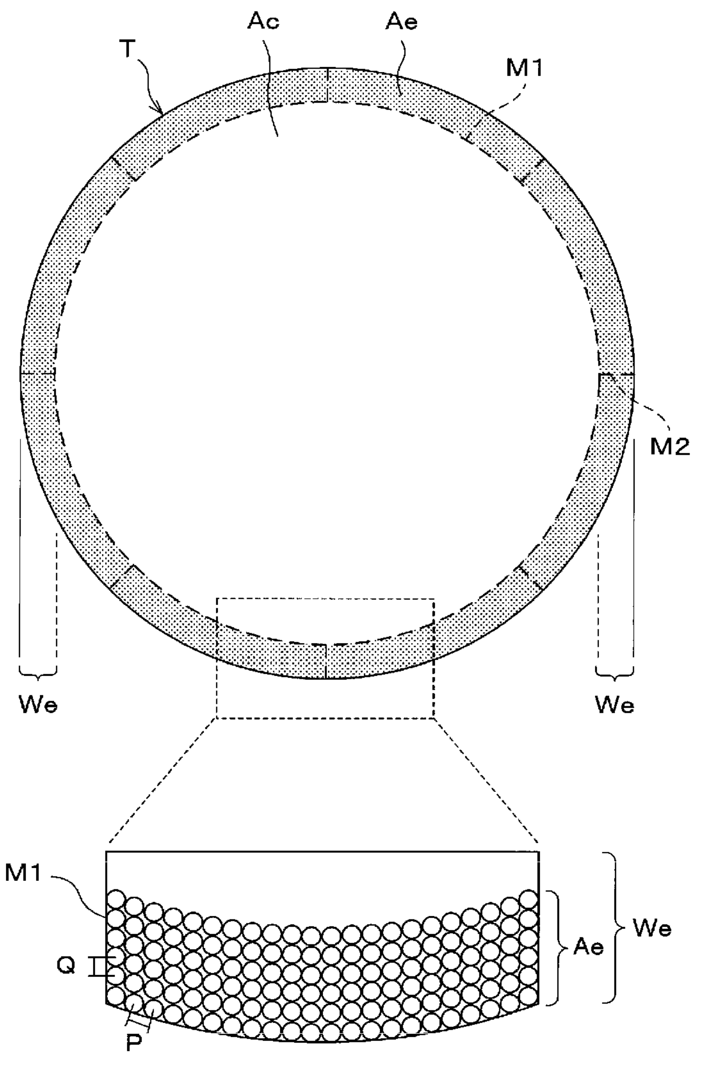
FIG. 5 is an explanatory diagram illustrating a state of the combined wafer radiated with laser light.

In the interface modifying apparatus 70, since the separation occurs at the interface between the first wafer W and the second wafer S in this way, there is formed the non-bonding region Ae in which bonding strength between the first wafer W and the second wafer S is reduced. That is, at the interface between the first wafer W and the second wafer S, the non-bonding region Ae is formed in an annular shape, and, also, a bonding region Ac in which the first wafer W and the second wafer S are bonded is formed at an inner side than the non-bonding region Ae in the radial direction, as shown in FIG. 5. In the edge trimming to be described later, the peripheral portion We of the first wafer W as a target of removing is removed. Since the non-bonding region Ae exists as described above, the removing of the peripheral We can be carried out appropriately.

A detailed method of forming the non-bonding region Ae in the interface modifying apparatus 70 will be discussed later.

Figure 4C:
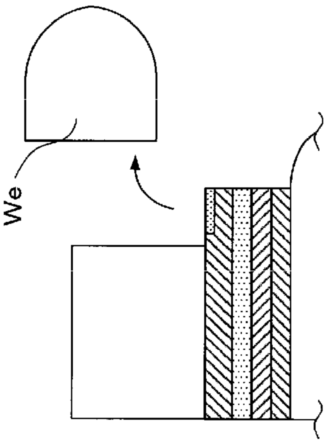

The combined wafer T in which the non-bonding region Ae is formed is then transferred to the periphery removing apparatus 50 by the wafer transfer device 40. In the periphery removing apparatus 50, the removal of the peripheral portion We of the first wafer W, that is, the edge trimming is performed, as illustrated in FIG. 4C. At this time, the peripheral portion We is separated from a central portion of the first wafer W starting from the peripheral modification layer M1, and is completely separated from the second wafer S starting from the non-bonding region Ae. Further, at this time, the peripheral portion We being removed is divided into small pieces starting from the split modification layer M2.

In removing the peripheral portion We, a wedge-shaped blade, for example, may be inserted into the interface between the first wafer W and the second wafer S forming the combined wafer T. Further, by discharging, for example, an air blow or a water jet, the peripheral portion We may be removed by being hit. In this way, in the edge trimming, by applying an impact to the peripheral portion We of the first wafer W, the peripheral portion We is separated starting from the peripheral modification layer M1. Since the bonding strength between the first wafer W and the second wafer S is reduced in the non-bonding region Ae as stated above, the peripheral portion We is appropriately removed from the second wafer S.

Figure 4D:
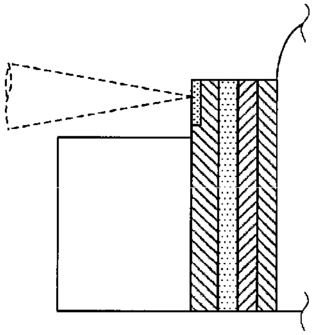

The combined wafer T from which the peripheral portion We of the first wafer W is removed is then transferred to the cleaning apparatus 60 by the wafer transfer device 40. In the cleaning apparatus 60, a peripheral portion of the second wafer S (hereinafter, sometimes referred to as "exposed surface" after the edge trimming) after the peripheral portion We is removed is cleaned, as shown in FIG. 4D.

In the cleaning apparatus 60, by radiating laser light for cleaning (for example, $CO_2$ laser) to the exposed surface of the second wafer S, the exposed surface may be modified and removed, so that particles or the like remaining on the exposed surface are removed (cleaned). For example, by supplying a cleaning liquid to the exposed surface of the second wafer S while rotating the combined wafer T, the exposed surface may be cleaned by spinning.

In addition, in the cleaning apparatus 60, the rear surface Sb of the second wafer S may be further cleaned together with the exposed surface of the second wafer S.

Thereafter, the combined wafer T after being subjected to all the required processings is transferred to the cassette C of the cassette placing table 10 by the wafer transfer device 20 via the transition apparatus 30. In this way, the series of processes of the wafer processing in the wafer processing system 1 are completed.

In the above description, after the peripheral modification layer M1 and the split modification layer M2 are formed by the internal modifying apparatus 80, the non-bonding region Ae is formed by the interface modifying apparatus 70, as shown in FIG. 4A and FIG. 4B. However, the sequence of the wafer processing in the wafer processing system 1 is not limited thereto. That is, the peripheral modification layer M1 and the split modification layer M2 may be formed by the internal modifying apparatus 80 after the non-bonding region Ae is formed by the interface modifying apparatus 70.

Here, in the interface modifying apparatus 70, the laser light is radiated from the laser radiation system 110 to the laser absorbing film Fw formed at the interface between the first wafer W and the second wafer S. The radiated laser light is absorbed by the laser absorbing film Fw. At this time, the laser absorbing film Fw accumulates energy by absorbing the laser light, so that the temperature of the laser absorbing film Fw increases and the laser absorbing film Fw is expanded. Due to this expansion of the laser absorbing film Fw, a shear stress is generated at the interface between the first wafer W and the laser absorbing film Fw (in the combined wafer T2 shown in FIG. 1B, the interface between the first wafer W and the surface film Fm2 having weak adhesion), which causes separation at the interface between the first wafer W and the laser absorbing film Fw (surface film Fm2). That is, the non-bonding region Ae in which the bonding strength between the first wafer W and the second wafer S is reduced due to the separation is formed at the position to which the laser light is radiated.

As stated above, in the interface modifying apparatus 70, the non-bonding region Ae is typically formed at the interface between the laser absorbing film Fw (surface film Fm2) and the first wafer W. However, when the thickness of the laser absorbing film Fw is small, there is a concern that a throughput regarding the edge trimming of the first wafer W may be deteriorated. To be specific, since the expansion amount of the laser absorbing film Fw due to the absorption of the laser light decreases as the amount of the energy absorbed and accumulated in the laser absorbing film Fw decreases, the shear stress generated at the interface between the first wafer W and the laser absorbing film Fw (surface film Fm2) is reduced, which raises a concern that the interface between the first wafer W and the laser absorbing film Fw (surface film Fm2) may not be separated properly, resulting in a failure to form the non-bonding region Ae appropriately.

To solve the problem, in the present exemplary embodiment, the metal film Fm as the separation facilitating film is formed at the interface between the first wafer W and the second wafer S, as illustrated in FIG. 1A and FIG. 1B. A film whose adhesive strength to the surface film Fe is weaker than the adhesive strength between the first wafer W and the laser absorbing film Fw (surface film Fm2) at least is used as the metal film Fm. In other words, according to the present exemplary embodiment, an interface between the metal film Fm and the surface film Fe having lower adhesive strength than the interface between the first wafer W and the laser absorbing film Fw is formed at the interface between the first wafer W and the second wafer S.

Thus, by separating the peripheral portion We at the interface between the metal film Fm and the surface film Fe, a throughput in the interface modifying apparatus 70 can be appropriately improved as compared to the conventional case where the separation is performed (the non-bonding region Ae is formed) at the interface between the first wafer W and the laser absorbing film Fw (surface film Fm2).

Further, the present inventors have conducted intensive research and found out that the interface between the metal film Fm and the surface film Fe having the weak adhesive strength can be selectively separated (the non-bonding region Ae can be formed) by controlling a pulse pitch P, which is a radiation interval of the laser light to the laser absorbing film Fw in a circumferential direction, and an index pitch Q, which is a radiation interval of the laser light to the laser absorbing film Fw in the radial direction (see FIG. 5: hereinafter, the pulse pitch P and the index pitch Q may sometimes be simply referred to "radiation interval" together).

Figure 6:
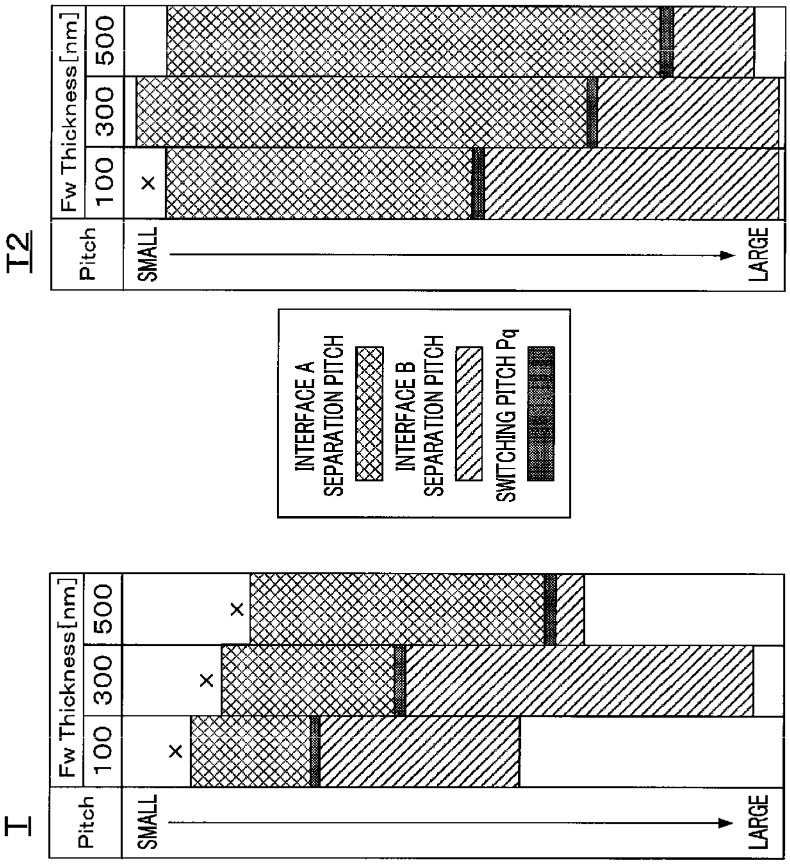
FIG. 6 is a table showing a correlation between a thickness of a laser absorbing film and a radiation interval of the laser light, and a position of a separation surface of a first wafer.
Figures 7A, 7B:
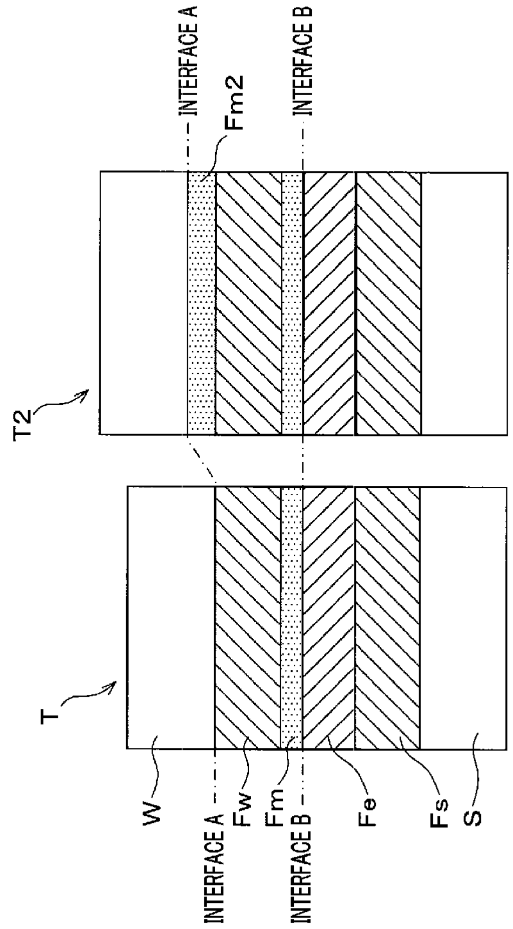
FIG. 7A and FIG. 7B are explanatory diagrams illustrating the position of the separation surface of the first wafer.

To elaborate, as illustrated in FIG. 6, it is found out that when the radiation interval of the laser light to the laser absorbing film Fw is set to be narrow, the separation occurs at the interface (interface A: see FIG. 7A and FIG. 7B) between the first wafer W and the laser absorbing film Fw (surface film Fm2), whereas when the radiation interval is set to be wide, the separation occurs at the interface (interface B: see FIG. 7A and FIG. 7B) between the metal film Fm and the surface film Fe. Based on these observations, the present inventors have found a possibility of improving the throughput regarding the edge trimming of the first wafer W by widening the radiation interval of the laser light to thereby form the non-bonding region at the interface (interface B) between the metal film Fm and the surface film Fe. Further, in the following description, as illustrated in FIG. 6, the radiation interval at which the separation occurs at the interface A will sometimes be referred to as "interface A separation pitch", and the radiation interval at which the separation occurs at the interface B will sometimes be referred to as "interface B separation pitch."

In addition, the present inventors have also found out that the radiation interval of the laser light allowing the position of the separation surface of the first wafer W and the second wafer S to be switched between the interface A and the interface B (hereinafter, referred to as "switching pitch Pq") varies depending on the thickness of the laser absorbing film Fw. Specifically, as shown in FIG. 6, it is found that the switching pitch Pq increases with a rise of the thickness of the laser absorbing film Fw.

Now, a method of forming the non-bonding region Ae at the interface between the first wafer W and the second wafer S, which is performed by the interface modifying apparatus 70 based on the above-described knowledge, will be explained.

Figure 8:
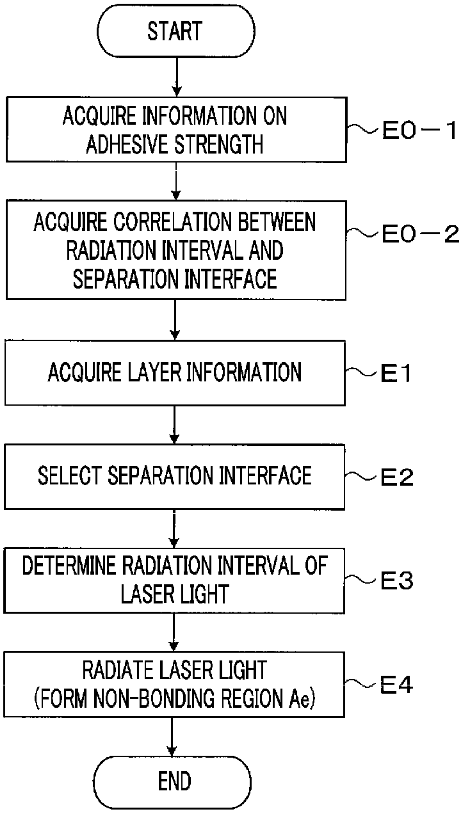
FIG. 8 is a flowchart illustrating main processes of the wafer processing according to the exemplary embodiment.

In forming the non-bonding region Ae in the interface modifying apparatus 70, information on types of films that can be formed at the interface between the first wafer W and the second wafer S and information on adhesive strength of various interfaces in the case of bonding the various films are outputted to the control device 90 as a pre-process (process E0-1 in FIG. 8).

In addition, a table of FIG. 6 showing a correlation between the adhesive strength of the various interfaces and the radiation interval (pulse energy) of the laser light required in the separation of those interfaces is prepared in advance (process E0-2 in FIG. 8).

In forming the non-bonding region Ae in the interface modifying apparatus 70, information on the types of the films formed at the interface between first wafer W and the second wafer S and information on the thickness of the laser absorbing film Fw are first obtained as layer information of the combined wafer T in which the non-bonding region Ae is to be formed (process E1 in FIG. 8). The obtained layer information of the combined wafer T is outputted to the control device 90.

The layer information of the combined wafer T may be acquired by the interface modifying apparatus 70, or may be obtained at the outside of the interface modifying apparatus 70 in advance.

Further, the acquired layer information of the combined wafer T is not limited to the information of the types of the films and the information of the thickness of the laser absorbing film Fw. Other information such as the thickness of the non-illustrated device layer and the tendency of the surface shape of the first wafer W or the second wafer S (for example, whether it is convex or concave) may be obtained.

Once the layer information of the combined wafer T is acquired, among the interfaces of the various films formed at the interface between the first wafer W and the second wafer S (the interface A or B and the interface between the laser absorbing film Fw and the metal film Fm in the above-described exemplary embodiment), the interface having the weakest adhesive strength (interface B in the above-described exemplary embodiment), which is to be used as a separation interface, is then selected based on the acquired layer information (process E2 in FIG. 8). The adhesive strength at the interfaces of the various films can be obtained by comparing the information outputted to the control device 90 in the process E0-1, for example.

Once the interface having the weak adhesive strength is selected, the radiation interval (the pulse pitch P and the index pitch Q) of the laser light to be radiated from the laser radiation system 110 to the laser absorbing film Fw is then decided (process E3 in FIG. 8).

Specifically, based on the thickness of the laser absorbing film Fw obtained in the process E1 and the correlation (see FIG. 6) between the adhesive strength of the various interfaces and the radiation interval of the laser light required in the separation of those interfaces obtained in the process E0-2, the radiation interval of the laser light is decided within a radiation interval (interface B separation pitch in the above-described exemplary embodiment) allowing the non-bonding region Ae to be formed selected at the selected interface.

After the radiation interval of the laser light is decided, the laser light is radiated to the laser absorbing film Fw of the combined wafer T held by the chuck 100 at the determined radiation interval (process E4 in FIG. 8). Specifically, the frequency of the laser light or the rotational speed of the chuck 100 (combined wafer T) is controlled so that the laser light is radiated at the determined pulse pitch P, and the moving speed of the chuck 100 (combined wafer T) in the Y-axis direction is controlled so that the laser light is radiated at the determined index pitch Q.

Thereafter, if the non-bonding region Ae is formed as the laser light is radiated to the entire surface of the laser absorbing film Fw at the peripheral portion We as a target of removing, the series of processes of the wafer processing in the interface modifying apparatus 70 are ended.

As described above, according to the present exemplary embodiment, in the removal (edge trimming) of the peripheral portion We of the first wafer W, by radiating the laser light to the laser absorbing film Fw formed at the interface between the first wafer W and the second wafer S, the non-bonding region Ae is formed, so that the bonding strength at the interface between the first wafer W and the second wafer S is reduced. At this time, since the metal film Fm whose adhesive strength to the surface film Fe is weaker than the adhesive strength between the first wafer W and the laser absorbing film Fw is formed at the interface between the first wafer W and the second wafer S, the peripheral portion We can be appropriately separated at the interface (interface B) between the metal film Fm and the surface film Fe even when it is difficult to separate the peripheral portion We at the interface (interface A) between the first wafer W and the laser absorbing film Fw. Further, since the separation of the first wafer W and the second wafer S (that is, the formation of the non-bonded region Ae) can occur at the interface B where the adhesive strength is weak, the throughput regarding the formation of the non-bonding region Ae can be appropriately improved, as compared to the case where the separation (that is, the formation of the non-bonding region Ae) occurs at the interface A.

In particular, according to the present exemplary embodiment, even when the thickness of the laser absorbing film Fw is small so it has been conventionally difficult to separate the peripheral portion We at the interface A, it is possible to appropriately separate the peripheral portion We at the interface B.

Furthermore, according to the present exemplary embodiment, the edge trimming of the first wafer W can be performed with substantially constant pulse energy regardless of the thickness of the laser absorbing film Fw formed at the interface of the combined wafer T.

Specifically, in a conventional combined wafer in which the metal film Fm is not formed at the interface, when the thickness of the laser absorbing film Fw is small, the volume that absorbs the pulse energy is small so energy absorption efficiency is low, as shown in a comparative example of FIG.

9. As a result, the pulse energy required in the separation increases. In other words, energy control associated with the separation of the first wafer W (formation of the non-bonding region Ae) becomes complicated, which leaves a room for improvement in terms of energy efficiency.

Figure 9:
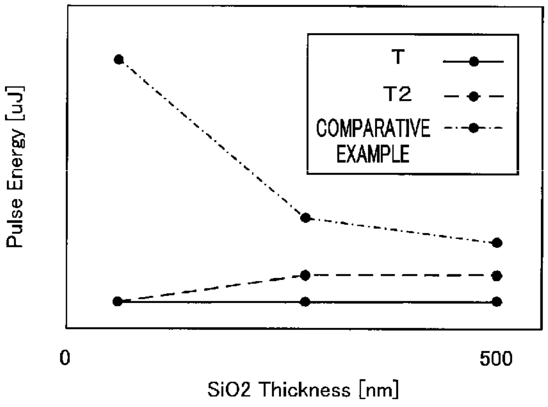
FIG. 9 is a graph showing a relationship between the thickness of the laser absorbing film and pulse energy of the laser light.

On the other hand, in the combined wafer T (T2) according to the present exemplary embodiment in which the metal film Fm is formed at the interface, the first wafer W can be separated (that is, the non-bonding region Ae can be formed) with substantially constant pulse energy regardless of the thickness of the laser absorbing film Fw, as shown in FIG. 9. In other words, according to the present exemplary embodiment, the separation of the first wafer W (formation of the non-bonding region Ae) can be carried out with high energy efficiency through a simple control.

Further, as depicted in FIG. 6, the interface A becomes the separation surface of the first wafer W when the radiation interval is equal to or less than the switching pitch Pq, whereas the interface B becomes the separation surface of the first wafer W when the radiation interval is larger than the switching pitch Pq. In other words, the radiation interval of the laser light for the purpose of separating the first wafer W at the interface B, for example, may be arbitrarily selected within the interface B separation pitch described above.

Therefore, in the determination of the radiation interval of the laser light in the process E3 of the above-described exemplary embodiment, by radiating the laser light at an arbitrary radiation interval within the interface B separation pitch, the throughput in the interface modifying apparatus 70 can be appropriately controlled.

To elaborate, by radiating the laser light at the largest radiation interval within the interface B separation pitch, for example, the throughput in the interface modifying apparatus 70 can be improved to the maximum.

For example, by radiating the laser light at an arbitrary radiation interval within the interface B separation pitch, a laser processing time in the interface modifying apparatus 70 can be adjusted to a laser processing time required in the wafer processing system 1, whereby a tact can be easily adjusted between the interface modifying apparatus 70 and other processing apparatuses. In other words, the overall wafer processing in the wafer processing system 1 can be optimized, that is, the overall throughput in the wafer processing system 1 can be improved.

Moreover, in the above-described exemplary embodiment, the radiation interval of the laser light for the laser absorbing film Fw is determined based on the thickness of the laser absorbing film Fw formed at the interface of the combined wafer T as described above. Instead of this, however, when it is necessary to perform a control with a certain required radiation interval of the laser light in the interface modifying apparatus 70, the combined wafer T may be formed by determining the thickness of the laser absorbing film Fw based on the required radiation interval.

Further, the above exemplary embodiment has been described for the example where the laser light is radiated to the laser absorbing film Fw located at the position corresponding to the peripheral portion We in order to perform the removal of the peripheral portion We of the first wafer W, that is, to perform the edge trimming in the wafer processing system 1. However, the wafer processing performed in the wafer processing system 1 is not limited to the edge trimming.

Figure 10A:
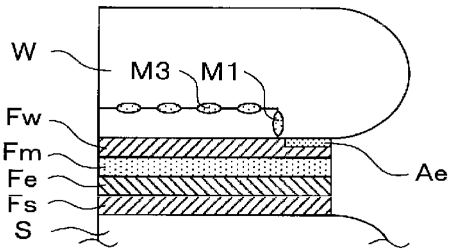
FIG. 10A and FIG. 10B are explanatory diagrams illustrating main processes of another wafer processing in the wafer processing system.
Figure 10B:
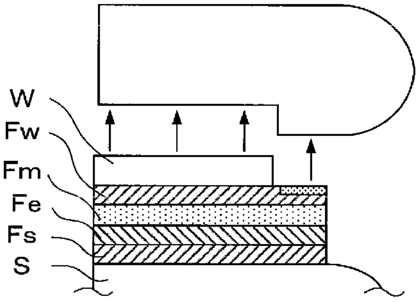

For example, as illustrated in FIG. 10A and FIG. 10B, the technique of the present disclosure can also be applied to a case in which an internal modification layer M3 serving as a starting point when thinning the first wafer W is formed inside the first wafer W and the peripheral portion We is removed as one body with the rear surface Wb side of the first wafer W.

Specifically, as shown in FIG. 10A, after sequentially forming the peripheral modification layer M1 and the internal modification layer M3 in the internal modifying apparatus 80, the non-bonding region Ae is also formed at the position corresponding to the peripheral portion We in the interface modifying apparatus 70. Thus, as illustrated in FIG. 10B, the first wafer W is thinned starting from the internal modification layer M3, and the peripheral portion We is removed as one body therewith by being separated starting from the peripheral modification layer M1 and the non-bonding region Ae.

Even in this case, by forming the metal film Fm at the interface between the first wafer W and the second wafer S and controlling the radiation interval of the laser light to the laser absorbing film Fw as described above, the position of the separation surface of the peripheral portion We can be appropriately selected from the interface A and the interface B. In other words, the first wafer W can be appropriately separated from the second wafer S regardless of the thickness of the laser absorbing film Fw.

Figure 11A:
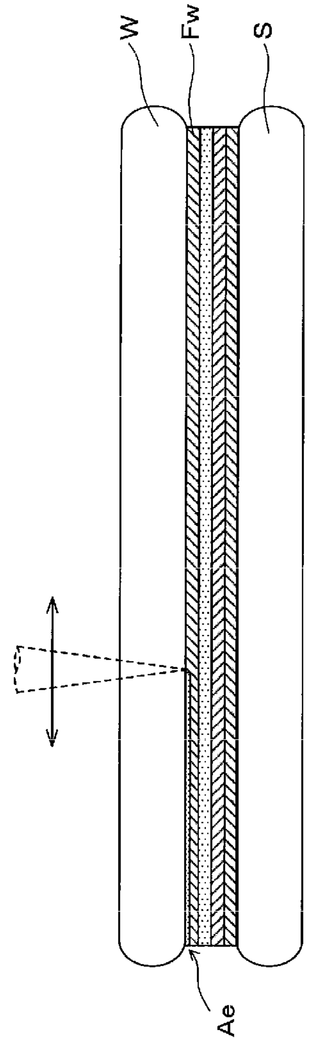
FIG. 11A and FIG. 11B are explanatory diagrams illustrating main processes of still another wafer processing in the wafer processing system.
Figure 11B:
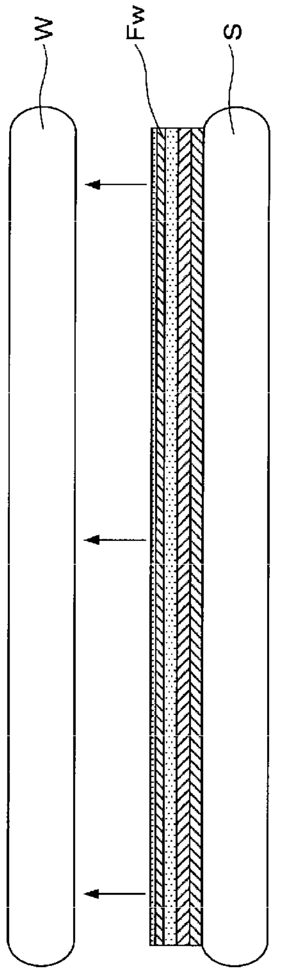

Furthermore, as illustrated in FIG. 11A and FIG. 11B, for example, the technique of the present disclosure may also be applicable to a case where the entire surface of the first wafer W is separated from the second wafer S to transfer a non-illustrated device layer formed on the front surface Wa of the first wafer W to the second wafer S, that is, a case where so-called laser lift-off is performed.

Specifically, as shown in FIG. 11A, by radiating the laser light to the laser absorbing film Fw in the entire surface of the combined wafer T in the interface modifying apparatus 70, the non-bonding region Ae is formed. As a result, the bonding strength between the first wafer W and the second wafer S is reduced in the entire surface of the combined wafer T, so that the first wafer W can be appropriately separated from the second wafer S, as shown in FIG. 11B.

Even in this case, by forming the metal film at the interface between the first wafer W and the second wafer S as described above and by controlling the radiation interval of the laser light to the laser absorbing film Fw, the position of the separation surface of the first wafer W can be appropriately selected from the interface A and the interface B. In other words, the first wafer W can be appropriately separated from the second wafer S regardless of the thickness of the laser absorbing film Fw.

Furthermore, although the above exemplary embodiment has been described for the example where the separation facilitating film formed at the interface between the first wafer W and the second wafer S is the metal film Fm (for example, a tungsten film), the kind of the separation facilitating film is not limited thereto.

Specifically, the separation facilitating film is not particularly limited as long as at least its adhesive strength to the surface film Fe (or the laser absorbing film Fw) is different from the adhesive strength between the first wafer W and the laser absorbing film Fw, and the position of the separation surface can be selected in the radiation of the laser light to the laser absorbing film Fw.

Furthermore, the position where the separation facilitating film is formed is not limited to the example shown in FIG. 1A and FIG. 1B, that is, between the laser absorbing film Fw and the surface film Fe. For example, the separation facilitating film may be formed between the front surface Wa of the first wafer W and the laser absorbing film Fw. In this case, the separation facilitating film needs to be transmissive to the laser light from the laser radiation system 110.

Additionally, in the above-described exemplary embodiment, although the non-bonding region Ae is formed at the interface between the first wafer W and the second wafer S after the peripheral modification layer M1 and the split modification layer M2 are formed within the first wafer W as shown in FIG. 4A to FIG. 4D, the sequence of the wafer processing in the wafer processing system 1 is not limited thereto. That is, the peripheral modification layer M1 and the split modification layer M2 may be formed inside the first wafer W after the non-bonding region Ae is formed at the interface between the first wafer W and the second wafer S as described above.

Moreover, in the case where the peripheral portion We is removed as one body with the rear surface Wb side of the first wafer W as well as shown in FIG. 10A and FIG. 10B, the peripheral modification layer M1 and the internal modification layer M3 may be formed inside the first wafer W after the non-bonding region Ae is formed at the interface between the first wafer W and the second wafer S.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to separate the first substrate from the second substrate appropriately in the combined substrate in which the first substrate and the second substrate are bonded to each other.

We claim:

1. A substrate processing apparatus configured to process a combined substrate in which a first substrate and a second substrate are stacked on top of each other, the substrate processing apparatus comprising:

a substrate holder configured to hold the combined substrate;

a laser radiating unit configured to radiate laser light;

a moving mechanism configured to move the substrate holder and the laser radiating unit relative to each other; and a controller and a storage storing a computer program, wherein the storage and the computer program are configured, with the controller, to control the laser radiating unit and the moving mechanism, wherein an interface layer includes a plurality of films including a laser absorbing film stacked between the first substrate and the second substrate, and wherein the controller performs:

a control of acquiring information of the interface layer formed in the combined substrate:

a control of setting, based on the acquired information of the interface layer, a bonding interface having a weakest adhesive strength among bonding interfaces in the interface layer as a separation interface between the first substrate and the second substrate;

a control of deciding an interval of the laser light to be radiated to the laser absorbing film depending on the set separation interface; and a control of radiating the laser light to the laser absorbing film in a pulse shape at the decided interval.

2. The substrate processing apparatus of claim 1, wherein the moving mechanism comprises:

a rotating mechanism configured to rotate the substrate holder and the laser radiating unit relative to each other; and a horizontally moving mechanism configured to move the substrate holder and the laser radiating unit relative to each other in a horizontal direction, and wherein the controller performs a control of setting, as the interval of the laser light, an interval in a circumferential direction and an interval in a radial direction.

3. The substrate processing apparatus of claim 1, wherein the controller sets the interval of the laser light based on a thickness of the laser absorbing film such that a laser processing time on the combined substrate is minimized.

4. The substrate processing apparatus of claim 1, wherein the controller sets the interval of the laser light based on a thickness of the laser absorbing film such that a laser processing time on the combined substrate becomes a laser processing time required in the substrate processing apparatus.

5. The substrate processing apparatus of claim 1, further comprising:

an internal laser radiating unit configured to radiate laser light to an inside of the first substrate to form a modification layer serving as a starting point of separation of the first substrate.

6. The substrate processing apparatus of claim 5, further comprising:

a periphery removing unit configured to remove a peripheral portion of the first substrate as a removing target, wherein the internal laser radiating unit forms a peripheral modification layer serving as a starting point of separation of the peripheral portion of the first substrate as the removing target.

7. The substrate processing apparatus of claim 1, wherein the interface layer includes a separation facilitating film formed at an interface between the laser absorbing film and the second substrate, and the separation facilitating film is a tungsten film.

8. A substrate processing method of processing a combined substrate in which a first substrate and a second substrate are stacked on top of each other, wherein an interface layer includes a plurality of films including a laser absorbing film stacked between the first substrate and the second substrate, the substrate processing method comprising:

acquiring information of the interface layer formed in the combined substrate;

setting, based on the acquired information of the interface layer, a bonding interface having a weakest adhesive strength among bonding interfaces in the interface layer as a separation interface between the first substrate and the second substrate;

determining an interval of laser light to be radiated to the laser absorbing film depending on the set separation interface; and radiating the laser light to the laser absorbing film in a pulse shape at the determined interval.

9. The substrate processing method of claim 8, wherein the interval of the laser light includes an interval in a circumferential direction and an interval in a radial direction, and wherein while rotating the combined substrate and a radiating unit of the laser light relative to each other to achieve the interval in the circumferential direction and while moving the combined substrate and the radiating unit of the laser light relative to each other in a horizontal direction to achieve the interval in the radial direction, the laser light is radiated to the laser absorbing film from the radiating unit.

10. The substrate processing method of claim 8, wherein the interval of the laser light is set based on a thickness of the laser absorbing film such that a laser processing time on the combined substrate is minimized.

11. The substrate processing method of claim 8, wherein the interval of the laser light is set based on a thickness of the laser absorbing film such that a laser processing time on the combined substrate becomes a laser processing time required in the substrate processing apparatus.

12. The substrate processing method of claim 8, further comprising:

forming a modification layer serving as a starting point of separation of the first substrate by radiating laser light to an inside of the first substrate.

13. The substrate processing method of claim 12, further comprising:

removing a peripheral portion of the first substrate as a removing target, wherein the modification layer formed inside the first substrate includes a peripheral modification layer serving as a starting point of separation of the peripheral portion of the first substrate as the removing target.

* * * * *